(12) United States Patent
Wyland

(10) Patent No.: US 6,208,195 B1
(45) Date of Patent: *Mar. 27, 2001

(54) FAST TRANSMISSION GATE SWITCH

(75) Inventor: David C. Wyland, Morgan Hill, CA (US)

(73) Assignee: Integrated Device Technology, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/934,322

(22) PCT Filed: Mar. 17, 1992

(86) PCT No.: PCT/US92/02168

§ 371 Date: May 6, 1994

§ 102(e) Date: May 6, 1994

(87) PCT Pub. No.: WO92/16998

PCT Pub. Date: Oct. 1, 1992

Related U.S. Application Data

(62) Continuation of application No. 08/563,139, filed on Nov. 27, 1995, now abandoned, which is a continuation of application No. 08/119,156, filed as application No. PCT/US92/02168 on Mar. 17, 1992, now abandoned, which is a continuation-in-part of application No. 07/672,050, filed on Mar. 18, 1991, now abandoned.

(51) Int. Cl.$^7$ ................................................. H03K 17/687

(52) U.S. Cl. ........................ 327/434; 327/478; 327/482; 327/374

(58) Field of Search ................................. 307/248, 253, 307/254, 571, 572, 574, 577; 327/419, 478, 482, 427, 379, 389, 374, 434

(56) References Cited

U.S. PATENT DOCUMENTS 3,184,609 * 5/1965 Yee ........................................ 307/248
3,325,654    6/1967 Mrazek .

(List continued on next page.)

FOREIGN PATENT DOCUMENTS 2 260 618    4/1993 (GB) ............................. G11C/29/00
59-115616    7/1984 (JP) ............................. H03K/17/693

(List continued on next page.)

OTHER PUBLICATIONS

Quality Semiconductor 1991 Databook pp. 6–1 through 6–20.
Modern Microelectronic Circuit Design, IC Applications, Fabrication Technology, vol. II, 705–707.

(List continued on next page.)

Primary Examiner—Terry D. Cunningham
(74) Attorney, Agent, or Firm—Bever Hoffman & Harms, LLP

(57) ABSTRACT

An integrated circuit fast transmission switching device is provided which comprises a first input/output lead having a bus capacitance $C_b$; a second input/output lead having a bus capacitance $C_b$; a first bidirectional field-effect transistor having an internal resistance $R_i$ and an internal capacitance $C_i$ including a first input/output terminal and a second input/output terminal and a gate terminal, said first terminal being connected to said first lead and said second terminal being connected to said second lead, so as to pass bidirectional external data signals between said first and second leads when said transistor is turned on and so as to block the passage of external data signals between said first and second leads when said transistor is turned off; wherein $R_i$ and $C_i$ for the field-effect transistor are such that $R_i(C_i+C_b)$ is less than 6.5 nanoseconds; and a driver circuit including an external terminal for receiving an external on/off control signal; wherein said driver circuit is connected to the gate terminal so as to provide an internal on/off control signal to said gate terminal of said field-effect transistor.

31 Claims, 6 Drawing Sheets

U.S. PATENT DOCUMENTS

| | | | |
|---|---|---|---|
| 3,614,472 | 10/1971 | Kloppenborg . | |
| 3,617,771 | 11/1971 | Lee . | |
| 3,953,879 | 4/1976 | O'Connor-d' Arlach et al. . | |
| 4,004,160 | 1/1977 | Streit et al. . | |
| 4,081,792 | 3/1978 | Schussler et al. . | |
| 4,096,399 | 6/1978 | Davis et al. . | |
| 4,210,875 | 7/1980 | Beasom | 330/261 |
| 4,239,980 | 12/1980 | Takanaxhi et al. . | |
| 4,245,230 | 1/1981 | Kwok et al. . | |
| 4,412,242 | 10/1983 | Herman et al. . | |
| 4,423,341 * | 12/1983 | Shelly | 327/434 |
| 4,445,051 * | 4/1984 | Elmasry | 307/450 |
| 4,477,742 | 10/1984 | Janutka . | |
| 4,502,027 | 2/1985 | Ayasli | 333/103 |
| 4,511,815 | 4/1985 | Wood . | |
| 4,571,512 | 2/1986 | Schutten et al. . | |
| 4,571,513 | 2/1986 | Lade et al. . | |
| 4,571,606 | 2/1986 | Benjamin et al. . | |
| 4,574,207 | 3/1986 | Benjamin et al. . | |
| 4,574,208 | 3/1986 | Lade et al. . | |
| 4,574,209 | 3/1986 | Lade et al. . | |
| 4,577,125 * | 3/1986 | Allen | 307/455 |
| 4,577,208 | 3/1986 | Schutten et al. . | |
| 4,595,847 | 6/1986 | Weir . | |
| 4,612,465 | 9/1986 | Schutten et al. . | |
| 4,622,568 | 11/1986 | Schutten et al. . | |
| 4,628,307 * | 12/1986 | Crouse | 307/571 |
| 4,633,101 | 12/1986 | Masuda et al. . | |
| 4,638,187 | 1/1987 | Boler et al. . | |
| 4,639,754 | 1/1987 | Wheatley, Jr. et al. . | |
| 4,656,647 | 4/1987 | Hotine | 375/52 |
| 4,679,134 | 7/1987 | Bingham et al. | 363/61 |
| 4,692,781 | 9/1987 | Rountree et al. . | |
| 4,700,460 | 10/1987 | Dolny et al. . | |
| 4,704,550 * | 11/1987 | Hechtman | 307/571 |
| 4,705,759 | 11/1987 | Lidow et al. | 437/29 |
| 4,716,398 | 12/1987 | Eccleston et al. | 340/347 |
| 4,716,514 * | 12/1987 | Patel | 363/127 |
| 4,719,374 | 1/1988 | Bialo . | |
| 4,739,193 | 4/1988 | Doty, II . | |
| 4,740,717 | 4/1988 | Fletcher et al. . | |
| 4,758,990 | 7/1988 | Uchida . | |
| 4,760,439 | 7/1988 | Borkowicz et al. . | |
| 4,777,577 | 10/1988 | Bingham et al. | 363/60 |
| 4,779,029 | 10/1988 | Henderson et al. . | |
| 4,785,201 | 11/1988 | Martinez . | |
| 4,797,899 | 1/1989 | Fuller et al. | 375/7 |
| 4,803,612 | 2/1989 | Skovmand . | |
| 4,809,152 | 2/1989 | Bingham et al. | 363/61 |
| 4,810,911 | 3/1989 | Noguchi . | |
| 4,814,644 * | 3/1989 | Yamakawa | 307/355 |
| 4,820,942 | 4/1989 | Chan . | |
| 4,823,029 | 4/1989 | Gabara . | |
| 4,857,983 | 8/1989 | Baliga et al. . | |
| 4,882,295 | 11/1989 | Czubatvi et al. . | |
| 4,894,804 | 1/1990 | Uchida . | |
| 4,897,774 | 1/1990 | Bingham et al. | 363/61 |
| 4,908,799 | 3/1990 | Gaudronneau | 365/241 |
| 4,920,344 | 4/1990 | Henderson et al. . | |
| 4,933,574 | 6/1990 | Lien et al. . | |
| 4,959,873 | 9/1990 | Flynn et al. | 455/303 |
| 4,961,010 | 10/1990 | Davis . | |
| 4,961,100 | 10/1990 | Baliga et al. . | |
| 4,963,773 * | 10/1990 | Ayasli | 307/511 |
| 4,978,925 | 12/1990 | Dingwall et al. | 330/277 |
| 4,983,865 | 1/1991 | Ho et al. . | |
| 4,989,057 | 1/1991 | Lu . | |
| 4,999,761 | 3/1991 | Bingham et al. | 363/60 |
| 5,008,568 | 4/1991 | Leung et al. . | |
| 5,010,261 | 4/1991 | Steigerwald . | |
| 5,012,123 | 4/1991 | Ayasli et al. . | |
| 5,014,055 | 5/1991 | Dingwall et al. | 341/159 |
| 5,023,494 * | 6/1991 | Tsukii et al. | 327/427 |
| 5,038,051 | 8/1991 | Firman et al. . | |
| 5,059,823 | 10/1991 | Ahsanullah . | |
| 5,060,037 | 10/1991 | Rountree . | |
| 5,061,903 * | 10/1991 | Vasile | 330/331 |
| 5,062,110 | 10/1991 | Kobayashi et al. | 371/223 |
| 5,107,152 | 4/1992 | Jain et al. . | |
| 5,150,044 | 9/1992 | Hashizume et al. | 324/158 |
| 5,161,160 | 11/1992 | Yaguchi et al. | 371/22.3 |
| 5,166,604 | 11/1992 | Ahanin et al. | 324/158 R |
| 5,182,479 | 1/1993 | Behagel et al. . | |
| 5,254,974 | 10/1993 | Rebers et al. | 340/572 |
| 5,260,948 | 11/1993 | Simpson et al. | 371/22.3 |
| 5,317,205 | 5/1994 | Sato . | |
| 5,332,932 | 7/1994 | Runaldue . | |

FOREIGN PATENT DOCUMENTS

| | | | |
|---|---|---|---|
| 62-15922 | 1/1987 | (JP) | H03K/17/687 |
| 62-30378 | 2/1987 | (JP) | H01L/29/78 |
| 64-42863 | 2/1989 | (JP) | H01L/29/78 |
| 64-57672 | 3/1989 | (JP) | H01L/29/78 |
| 2-28939 | 1/1990 | (JP) | H01L/21/336 |
| 2-90628 | 3/1990 | (JP) | H01L/21/336 |
| 2-158171 | 6/1990 | (JP) | H01L/29/784 |
| 2-196434 | 8/1990 | (JP) | H01L/21/336 |
| 3-38839 | 2/1991 | (JP) | H01L/21/336 |
| 3-46272 | 2/1991 | (JP) | H01L/29/784 |
| 3-48428 | 3/1991 | (JP) | H01L/21/336 |
| 5-72290 | 3/1993 | (JP) . | |
| 1550617 | 3/1990 | (SU) | H03K/17/68 |

OTHER PUBLICATIONS

Texas Instruments "Scan Test Devices with Octal Bus Transceivers" Aug. 1992, revised Oct. 1992, pp. 8–3 through 8–23.

National Semiconductor's IEEE 1149.1—1990 Seminar Handbook.

A. Carlson and D. Gisser, *Electrical Engineering Concepts and Applications*, Addison–Wesley Publishing Company, 1981, pp. 362–365.

R. Gregorian and G. Temes, *Analog MOS Integrated Circuits for Signal Processing*, John Wiley & Sons, New York, 1986, pp. 99–117, 462–483.

P. Allen and E. Sanchez–Sinencio, *Switched Capacitor Circuits*, Van Nostrand Reinhold Co., New York, 1984, pp. 596–610.

Chatterjee et al., *A Low voltage Triggering SCR for On–Chip ESD Protection at Output and Input Pads*, IEEE Electron Device Letters, vol. 12, No. 1, Jan. 1991, pp. 21–22.

Boisvert et al., *The Complementary Insulated–Gate Bipolar Transistor (CIGBT)—A New Power Switching Device*, IEEE Electron Device Letters, vol. 11, No. 9, Sep. 1990, pp. 368–370.

Rieck et al., *Novel ESD Protection for Advanced CMOS Output Drivers*, EOS/ESD Symposium Proceedings, 1989, pp. 182–189.

Baker et al., *A "Waffle" Layout Technique Strengthens the ESD Hardness of the NMOS Output Transistor*, EOS/ESD Hardness of the NMOS Output Transistor, EOS/ESD Symposium Proceedings, 1989, pp. 175–181.

Wakaumi et al., *A Highly Reliable 16 Output High Voltage NMOS/CMOS Logic IC With a Shielded Source Structure*, IEEE—IEDM 83, 1983, pp. 416–419.

Chen et al., *Electrostatic Discharge Protection for One Micron CMOS Devices and Circuits*, IEEE—IEDM 86, 1986, pp. 484–487.

Anderson et al., *Electrostatic Discharge Effects in GaAs FETS and MODFETS*, EOS/EDS Symposium Proceedings, 1987, pp. 205–207.

Carr et al., *MOS/LSI Design and Application*, McGraw–Hill Book Compnay Book Company, pp. 298–301 and title page. Based upon information provided to the Applicant, the Applicant has reason to believe that this this document is dated 1972.

Tietze et al., *Electronic Circuits Design and Applications*, Springer–Verlag, 1991, pp. 656–661, 2 title pages, p. VII.

*DG642 SPDT Low On–Resistance Wideband/Video Switch*, Siliconix Inc. Data Book, Feb. 13, 1991, pp. 1–4.

*DG601 High Speed Quad SPST CMOS Analog Switch*, Siliconix Inc. Data Book, p. 5–225 to 5–235.

*Analog Switch/Multiplexer Selection Guide*, National Semiconductor Data Book, p. 2–4. Based upon information provided to the Applicant, the Applicant has reason to believe that this document is dated 1989.

*Family Circuit Characteristics*, Quickswitch Products Databook, 1995, p. 1–10.

Gonauser et al., *A Master Slice Design Concept Based on Master Cells in ESFI–SOS–CMOS Technology*, Siemens Forsch u Entwicki–Ber. Bd. 5, 1976 Nr. 6. pp. 344–349.

Kubinec, *Build a Programmable Word Generator with MOS ICs*, Electronic Design 2, Jan. 18, 1969, pp. 62–67.

Bowers, *Analogue Sampling ICs in Data Acquisition Systems*, Microelectron Reliab., vol. 19, pp. 497–511, 1980.

Allen et al., *CMOS Analog Circuit Design*, Holt, Rinehart and Winston, 1987, pp. 198–211 and 2 title pages.

Allen and Sanchez–Sinencio, *Switched Capacitor Circuits*, pp. 596–610. Van Nostrand Reinhold Co., 1984.

Allstot et al., *Technological Design Considerations for Monolithic MOS Switched–Capacitor Filtering Systems*, Reprinted from PROC. IEEE vol. 71, No. 8, Aug. 1983, pp. 967–986.

*MM54HC4016/MM74HC4016 Quad Analog Switch*, National Semiconductor Data Book, pp. 3–361–3–367.

*Fast CMOS Non–Inverting Buffer Transceiver*, Integrated Device Technology Inc., Jan. 1989, pp. S10–92 to S10–95.

*CMOS Integrated Circuits CD4066BM/CD4066BC Quad Bilateral Switch*, National Semiconductor CMOS Databook, pp. 1, 2–150 to 2–155. Based upon information provided to the Applicant, the Applicant has reason to believe that this document was published in a 1977 National Semiconductor data book.

*IDT Leading Edge CEMOS Technology*, High Speed CMOS Data Book, pp. S2–4 and title page, 1989.

*VLSI Technology Workshop on Key Technologies for 0.5 µm Manufacturing, IC Feature Size Trend*, 1991, pp. cover sheet and 62, National Semiconductor CMOS Databook cover.

*VLSI Design Techniques for Analog and Digital Circuits*, pp. 289–302. Based upon information provided to the Applicant, the Applicant has reason to believe that this document was authored by Geiger and published by McGraw–Hill, 1990, 5.

*Analog Switch Definition of Terms and Multiplexer Selection Guide*, National Semiconductor, p. 8–3 and unnumbered.

*High Speed Quad CMOS Analog Switch (DG601)*, Siliconix Inc. Data Book, Rev. C, pp. 1–189 to 1–199, Nov. 15, 1993.

*Low On–Resistance Wideband/Video Switches (DG641/642/643)*, Siliconix Inc. Data Book, Rev. C, pp. 1–208 to 1–217, Nov. 15, 1993.

*Nonideal Effects in Switched–Capacitor Circuits*, Chapter Seven, pp. 462–483.

*P54/74FCT3384 High Speed CMOS 10 Bit 3.3/5.0 Volt Bidirectional Translator*, Advance Information, Performance Semiconductor Corporation, 1992, 5 pages.

English language title and abstract form Dialog associated with Japanese Publication No. 2–28939.

English language title and abstract from Dialog associated with Japanese Publication No. 2–90628.

English language title and abstract from Dialog associated with Japanese Publication No. 2–158171.

English language title and abstract from Dialog associated with Japanese Publication No. 2–196434.

English language title and abstract from Dialog associated with Japanese Publication No. 3–38839.

English language title and abstract from Dialog associated with Japanese Publication No. 3–46272.

English language title and abstract from Dialog associated with Japanese Publication No. 3–48428.

English language title and abstract from Dialog associated with Japanese Publication No. 64–42863.

English language title and abstract from Dialog associated with Japanese Publication No. 64–576672.

English language title and abstract from Dialog associated with Japanese Publication No. 62–30378.

Muller et al., "Device Electronics For Integrated Circuits," Library of Congress Cataloging in Publication Data, p. 349–350, (1977).

* cited by examiner

FAST TRANSMISSION GATE SWITCH

This is a continuation of application Ser. No. 08/563,139, filed Nov. 27, 1995, now abandoned which is a continuation of application Ser. No. 08/119,156, filed May 6, 1994, now abandoned, which is a National Phase application of PCT/US92/02168, filed Mar. 17, 1992, which is a continuation-in-part of application Ser. No. 07/672,050, filed Mar. 18, 1991, now abandoned.

BACKGROUND OF THE INVENTION

This invention relates in general to signal switches and in particular, to a fast transmission gate switch, particularly useful for switching digital logic signals.

With the advent of very large-scale integrated circuits, the size of devices manufactured has been shrinking and the speed of the devices has continually increased. Most of the efforts, however, have been directed to designs where many circuits and the connections between them are made in the same medium such as a silicon chip. Since all the circuit components being fabricated are done in the same medium, devices may be made smaller by improved techniques such as improved lithography. By reducing the sizes of the devices and the lengths of the connections between them, the speed of the devices is increased due to a decrease in the inductances, resistances and capacitances of individual devices and of the connections between them.

Board level designs have not kept pace with the above-described development in very large-scale integrated circuits. Printed circuit board designs frequently have large capacitances which slow down signal propagation. Thus if two high speed logic chips are connected through a slower device, the overall speed of the system is determined by the slowest component, namely, the slow connecting device. Passive switching devices such as transmission gates have been used in printed circuit board level designs for switching signals between digital logic devices. The slow speed of this type of switches determines the speed of signal transmission even though the two logic devices may operate at much higher speeds. It is therefore desirable to provide a stand-alone switching device which is much faster than the conventional passive transmission gate.

In one type of improved switching circuits that is frequently used, instead of a passive switch, an active device such as a logic buffer is used. While a buffer used as a switch causes a delay that is less than that caused by the conventional passive transmission gate switch, the delay caused by such buffers may nevertheless be excessive and undesirable for some high speed applications. It is thus desirable to provide a high speed switch that causes less delay than the above described switches.

SUMMARY OF THE INVENTION

This invention is directed towards a stand-alone switch for switching signals between two nodes, where the two nodes are connected to conductors such as conducting traces on a printed circuit board, so that a signal propagating from one node to the other will experience an external capacitance $C_b$. The switch comprises two input/output pins and a switching pin, and a first transistor having a control terminal and a first and a second input/output terminal. Each input/output terminal of the transistor is connected to one of the nodes through an input/output pin for passing signals between the nodes through the transistor when the transistor is turned on and disconnecting the two nodes when the transistor is turned off. The switch further comprises means responsive to a switching signal at the switching pin for applying a control signal to the control terminal of the transistor for turning it on or off. The delay of signals passing through the switch is at least equal to the RC delay, which is the product of the resistance $R_i$ of the transistor between the two input/output pins and the sum of the internal capacitance $C_i$ of the switch and the external (e.g., bus) capacitance $C_b$. The values of $R_i$ and $C_i$ are such that, for a given value of $C_b$, $R_i(C_i+C_b)$ is less than the delay through a typical buffer, e.g. 6.5 nanoseconds. Hence, replacing the conventional buffer by the switch of this invention will reduce delay in signal propagation between the two nodes.

In the preferred embodiment, the applying means and the capacitance between the two input/output pins and the control terminal when the transistor is turned on are such that time required for the switching signal to turn on or off the transistor through the applying means is less than the time to turn on or off a typical buffer, e.g. 7 nanoseconds.

DETAILED DESCRIPTION OF THE PREFERRED EMBODIMENT

Figure 1:
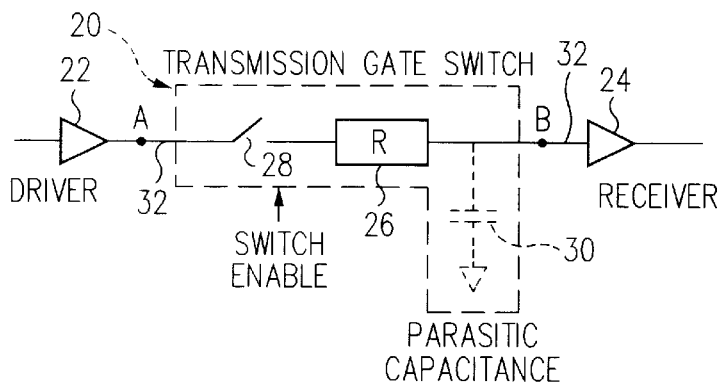
FIG. 1 is a schematic circuit diagram of a passive transmission gate switch and of a driver and receiver illustrating a conventional design of the switch.

FIG. 1 is a schematic circuit diagram of a conventional transmission gate switch 20 connected to the output of a driver 22 and the input of a receiver 24 at nodes A, B respectively. The signal to be switched appears at the output of driver 22. When switch 20 connects nodes A and B, such signal is transmitted to node B and appears at the input of receiver 24. Driver 22 and receiver 24 may each be part of another circuit chip package mounted on a printed circuit board where switch 20 is connected by conductive traces 22 through nodes A, B to these chip packages.

Switch 20 has resistance R so that the switch may be represented conceptually as a resistor 26 in series with a pure switch 28 as shown in FIG. 1. A signal propagating between nodes A and B will experience capacitive effects of traces 32 connecting switch 20 and receiver 24, of the receiver 24 and switch 20. Switch 20 is typically employed in the form of an electronic package with pins connected to nodes A, B. As defined on pages 705, 706 of *Modern Microelectronic Circuit Design, IC Applications, Fabrication Technology*, Vol. 2, by staff of Research and Education Association, Dr. Folgiel, Director, Research and Education Association, New York, N.Y. 1981, the parasitic capacitance of an electronic device package with leads or pins can be of two types, inter-lead capacitance and capacitance from lead-to-ground. Switch 20 has three leads, one connected to driver 22, the other connected to receiver 24 by traces 32 on a printed circuit board, and a third lead for the switch enable signal. There will be inter-lead capacitances between the three leads of switch 20, and there will also be capacitances between the three leads of switch 20 and ground.

The above described inter-lead and lead-to-ground capacitances of package 20, those introduced by traces 32 and other board level connections are represented conceptually by capacitor 30 connected between node B and ground and labeled "parasitic capacitance" in FIG. 1. Since this parasitic capacitance represented by the capacitor is inherent in the switch, capacitor 30 is shown in dotted lines. Obviously, the inter-lead capacitances as well as the lead-to-ground capacitances of switch 20 would depend on the size, geometry, material and the exact configuration of the package 20, its leads, and of traces 32 and other board level connections. The total internal capacitance of switch 20 is given by the total capacitive effect of the parasitic capacitance of capacitor 30, and the capacitance of other portions of switch 20, the value of which will depend on the structure of the switch. Therefore, the total capacitance seen by a signal propagating between nodes A and B is given by the effects of the internal capacitance of switch 20, the capacitance of receiver 24, and the capacitance of traces 32 connecting switch 20 to receiver 24. Thus the delay of the signal propagating from node A to node B is caused by two RC delays: (1) the product of the resistance R of resistor 26 and the capacitance of trace 32 connecting switch 20 and receiver and of receiver 24, and (2) the product of the resistance R of resistor 26 and the internal capacitance 30. The second (2) product will depend on the specific structure of switch 20, and will be omitted for now, since the first product alone makes switch 20 unsuitable for use in high speed switching between logic devices, as will be clear from the discussion below.

Figure 2:
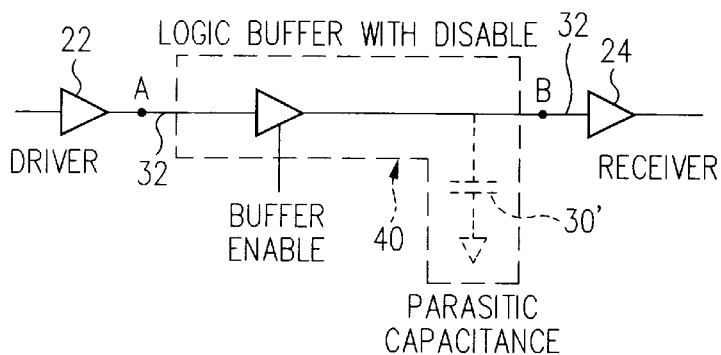
FIG. 2 is a schematic view of an active switch device using an enabled buffer and of a driver and receiver to illustrate another conventional design.

In typical printed circuit board designs for computer and logic applications, a typical capacitance of the bus (e.g., that of trace 32, of receiver 24 and other associated circuitry whose capacitance effects will be felt at node B) downstream from switch 20 is about 50 pF. Therefore, if switch 20 has a large resistance value, the RC time constant resulting from such resistance and the typical bus capacitance of 50 pF will be large, resulting in a significant signal delay when the signal propagates from A to B. The propagation delay introduced by the switch is therefore at least equal to the value of the RC time constant. A standard transmission gate switch is the CMOS 4016 integrated circuit. The typical resistance values of existing transmission gate switches such as the 4016 are in the range of 250–1,000 ohms. This type of switch would therefore introduce at least a delay of the order of 12–50 nanoseconds, assuming a 50 pF bus capacitance. Such delay is unacceptable for switching high speed signals required in many computer and logic applications. For this reason, the 4016 type switch is more commonly used in analog circuits and seldom in board level computer or digital logic designs. For the latter applications, active logic devices such as industry standard 74F244 buffers have been used such as shown in FIG. 2. To simplify the discussion, identical components and the figures of this application are identified by the same numerals.

As shown in FIGS. 1 and 2, transmission gate switch 20 has been replaced by a logic buffer 40 in FIG. 2. Driver 22 and receiver 24 may be part of computer or logic chip packages mounted on a printed circuit board and connected to buffer 40 by conductive traces 32 on the board. Buffer 40 is also in the form of a package having inter-lead and lead-to-ground parasitic capacitance, whose values may be different from those of switch 20; for this reason, such parasitic capacitances of buffer 40 are represented by capacitor 30', also shown in dotted lines. Buffer 40, however, introduces a delay of its own because of the inherent speed limitations of active logic. The 74F244 buffer driving a 50 pF load introduces a delay of about 6.5 nanoseconds. Thus while using a logic buffer 40 to replace switch 20 does reduce the delay in signal transmission, it is difficult to further reduce the delay introduced by the buffer itself. It is therefore desirable to provide an improved switching device where the above-described difficulties are alleviated.

This invention is based on the observation that, by employing a transistor having low inherent resistance and internal capacitance, the signal delay of the switch can be further reduced to a value below that of the active buffer in FIG. 2.

Figure 3:
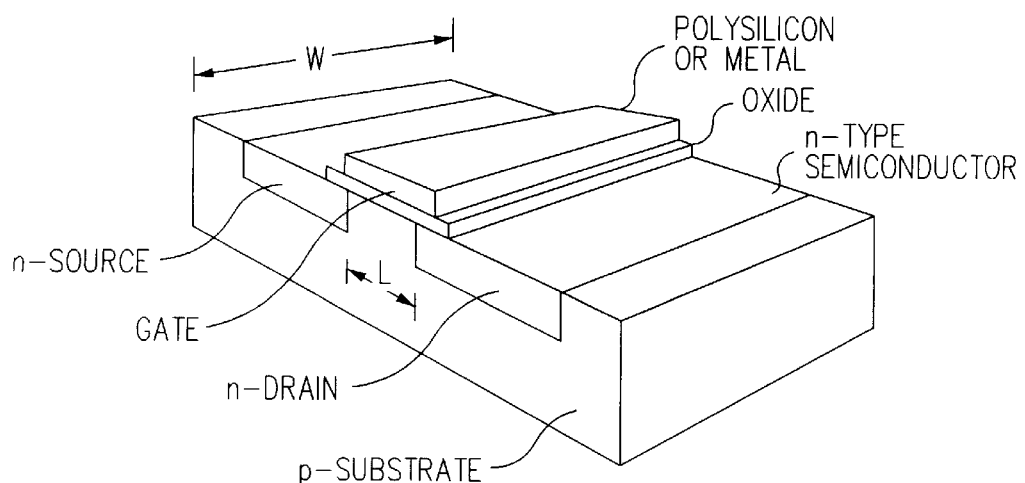
FIG. 3 is a perspective view of a MOS transistor useful for illustrating the invention.
Figure 4:
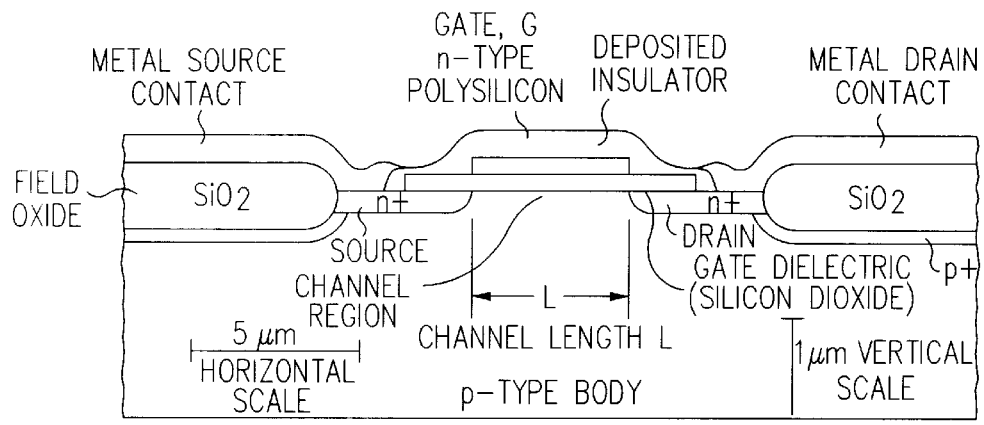
FIG. 4 is a cross-sectional view of the transistor of FIG. 3.

FIG. 3 is a perspective view of a MOS transistor useful for illustrating the invention. FIG. 4 is a cross-sectional view of the transistor of FIG. 3. As shown in FIGS. 3 and 4, the channel length of a MOS type transistor is the distance L between the source and drain regions of the transistor while the channel width is the dimension W of the transistor in the direction where the cross-sectional configuration of the transistor does not change. Another common definition of the channel length is the width of the gate that overlaps the active region of the transistor between the source and drain. Another common definition of the channel width is the length of the gate overlapping the active region of the transistor between the source and drain.

Figure 5A:
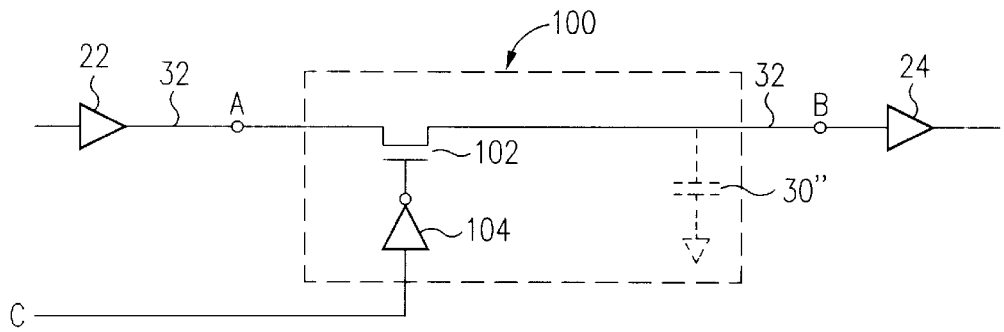
FIG. 5A is a schematic circuit diagram of a transmission gate switch and of a driver and receiver to illustrate the preferred embodiment of the invention.

FIG. 5A is a schematic circuit diagram of a transmission gate switch and of a driver and receiver to illustrate the preferred embodiment of the invention. As shown in FIG. 5A, the transmission gate 100 includes a N-channel MOS transistor 102 and a driver or gate 104 for controlling the gate of transistor 102 in response to an external signal from node C. The channel length of transistor 102 is preferably less than 1.5 microns, and in some applications preferably less than 1 micron. The channel width of transistor 102 is preferably more than 1,000 microns and in some instances preferably 1,200 microns or more. In reference to FIGS. 3 and 4, by reducing the channel length, the resistance of the resistor is reduced since current carriers have a shorter distance to travel in order to conduct current between nodes A, B. By using a transistor with large channel width compared to the transistors in the 4016 type gate, the resistance of transistor 102 is further reduced in comparison. With the above-described design for transistor 102, it is found that the inherent resistance of transmission gate switch 100 between nodes A, B when the transistor 102 is turned on, (on-resistance) can be reduced to a value of less than 50 ohms may be suitable. Applicant has discovered that in some designs, the resistance of switch 100 when transistor 102 is turned on may be reduced to a value of less than 5 ohms. Shorter channel lengths also result in reduced capacitance of transistor 102. The internal capacitance of the switch 100 and its effect on signal delay will be discussed in more detail below in reference to FIGS. 5B–5E.

Figure 5B:
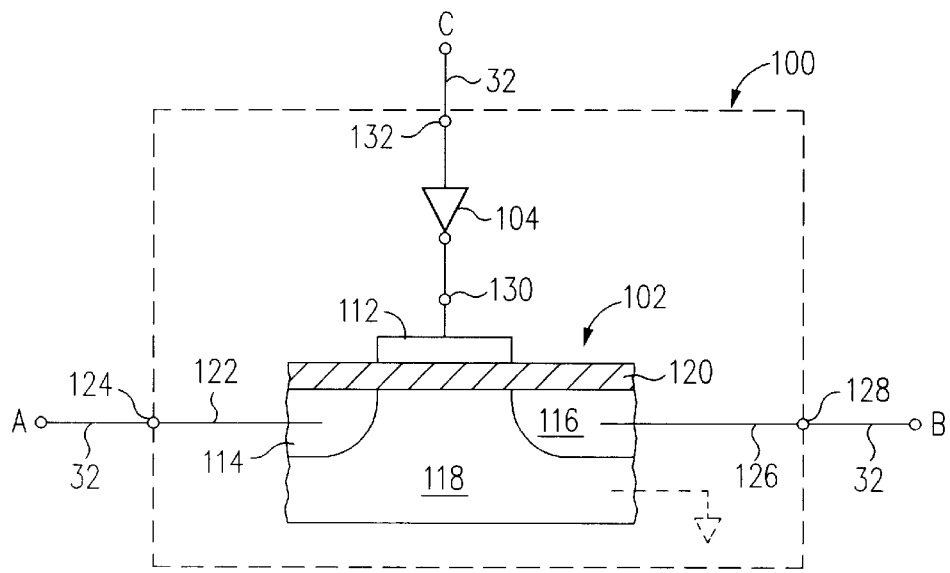
FIG. 5B is a partially cross-sectional view and partially schematic view of the transmission gate switch of FIG. 5A.

FIG. 5B illustrates in more detail the structure of transmission gate switch 100 of FIG. 5A. In FIG. 5B, a partial cross-sectional view of a portion of transistor 102 is shown. Transistor 102 includes a gate 112, drain 114, source 116, and substrate 118 where the gate is separated from the drain and source and substrate by an insulating layer 120. Drain 114 is connected through a conductor 122 through a package body (not shown) of switch 100 to an input/output pin (shown symbolically) at 124. Similarly, source 116 is connected through a conductor 126 through the package body (not shown) to input/output pin 128. Pin 124 is connected to node A of FIG. 5A through trace 32 and pin 128 is connected to node B by means of another trace 32. The output of driver 104 is connected to gate 112 through node 130. The driver receives the switching signal from node C through pin 132. In reference to FIGS. 5A, 5B, the inter-lead parasitic capacitance of switch 100 would be the capacitances between the pins 124, 128, 132 and the lead-to-ground parasitic capacitances of switch 100 would be the capacitances of pins 124, 128, 132 to ground. In addition to experiencing such capacitances, a signal passing between pins 124, 128 will also experience the effects of the capacitances between gate 124 on the one hand and the drain 114 and source 116 on the other, as well as capacitances between drain 114, source 116, and substrate 118, referred to as the capacitance of the transistor. The internal capacitance of the switch 100 is given by the total capacitive effects of the capacitance of the transistor and the parasitic capacitance of the switch consisting of the inter-lead and lead-to-ground capacitances and represented by capacitor 30" in FIG. 5A.

The most important components of the above-enumerated capacitances are the lead-to-ground capacitances and the gate to drain and source capacitances. For many commonly used packages, total capacitive effects of the inter-lead and lead-to-ground capacitances are of the order of 8 or 10 pF experienced by signals transmitted through the leads of the package. In one implementation of transistor 102, the gate to drain and source capacitances amount to about 1 or 2 pF and each of the lead-to-ground capacitances of pins 124, 128, 132 amount to about 4 pF. As indicated in the 1991 Data Book, page 5–24, by Quality Semiconductor, Inc., assignee of the present application, the on internal capacitance of a switch having characteristics similar to that of switch 100 is about 10 pF and its off capacitance is about 6 pF. Thus when transistor 102 is turned off, the internal capacitance seen at either pin 124 or 128 will be the gate to drain and source capacitance and the lead-to-ground capacitance of that particular pin. Whereas if the transistor 102 is on, the internal capacitance seen at either pin would also include the lead-to-ground capacitance of the other pin as well. For this reason, the internal capacitance of switch 100 seen at either pin 124 or 128 will be higher when the transistor is on compared to that seen when the transistor is off. Typically, substrate 118 is connected to ground and node 130 at the output of driver 104 is at a stable DC potential when the transistor is not being turned on or off.

Figure 5C:
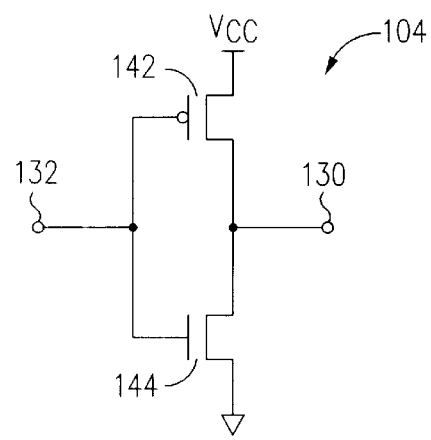
FIG. 5C is a schematic circuit diagram illustrating in more detail one embodiment of the driver 104 of FIG. 5B.

FIG. 5C is a schematic circuit diagram illustrating one embodiment of driver 104. As shown in FIG. 5C, driver 104 is an inverter comprising a P-channel transistor 142 and an N-channel transistor 144 connected in parallel between switching pin 132 (switching pin of switch 100) and node 130. As also indicated in FIG. 5C, the two transistors are connected to a power rail VCC and ground as usual. While the driver 104 is shown as an inverter, it will be understood that other driver or gate configurations may be used, such as NOR- or NAND-gates. Since the parasitic capacitance for switch 100 may be different from those of switches 20 and 40, the capacitor in FIG. 5A is labeled 30" to show that is may be different from those of switches 20 and 40.

Figure 5D:
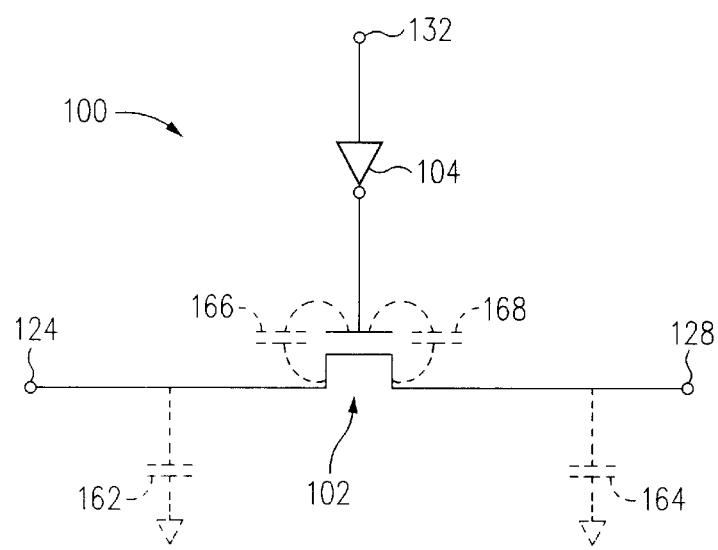
FIG. 5D is a schematic view of the switch of FIG. 5B, illustrating in more detail the capacitances of the switch.

FIG. 5D is a schematic view of switch 100 illustrating in more detail some of the more significant capacitances in the switch. Thus, the lead-to-ground capacitance of lead 124 is illustrated by capacitor 162 shown in phantom, and the lead-to-ground capacitance of lead 128 is illustrated by capacitor 164 shown in phantom. The gate to drain and gate to source capacitances are shown in phantom as capacitors 166, 168.

In the implementation indicated above and in the 1991 Data Book of Quality Semiconductor, Inc., the capacitance of switch 100 when the transistor is on is about 10 pF. Hence, the propagation delay caused by the resistance and internal capacitance of the switch, assuming a resistance value between pins 124 and 128 of about 5 ohms, is about 0.05 nanoseconds. If the bus capacitance is 50 pF, then the RC delay caused by the switch resistance of about 5 ohms and bus capacitance of 50 pF is about 0.25 nanoseconds, so that the total delay seen by a signal propagating through the switch to reach the receiver is about 0.3 nanoseconds, well below the 6.5 nanoseconds delay caused by the typical conventional buffer.

Figure 5E:
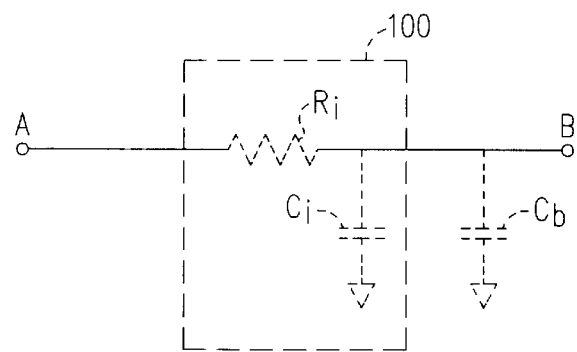
FIG. 5E is a conceptual circuit diagram illustrating the RC delay experienced by a signal propagating from node A to node B to illustrate the invention.

FIG. 5E is a conceptual circuit diagram illustrating the RC delay experienced by a signal propagating from node A to node B. Thus, in reference to FIG. 5E, the resistance of transistor 102 is $R_i$, the internal capacitance of the switch is $C_i$ and the bus capacitance is $C_b$, where the resistor and the two capacitors are shown in phantom since they represent the respective resistance and capacitances of the switch and bus and are not real circuit elements. Then the total RC delay caused by the switch as seen by a signal propagating from node A to node B is given by $R_i(C_i+C_b)$. As long as this total delay $R_i(C_i+C_b)$ caused by the switch 100 is less the typical delay caused by the buffer of 6.5 nanoseconds for a 74F244 buffer driving a 50 pF load, it is advantageous to replace the buffer by the switch of this invention. Thus, for any given bus capacitance $C_b$, $R_i$ and $C_i$ are chosen so that the total delay $R_i(C_i+C_b)$ caused by the switch 100 is less the typical delay caused by the buffer.

The above-described transmission gate switch 100 may be used advantageously to replace active logic devices such as 74F244, 74F245 for switching high speed digital logic signals in a board level design. The replacement of the active device with device 100 will greatly reduce the propagation delay, logic noise (e.g., "ground bounce" noise) and power dissipation associated with the active device replaced. Please see the "Application Note AN-01" of the 1991 Data Book of Quality Semiconductor, Inc. Switch 100 is also inherently bi-directional. Other embodiments of the switch described below in reference to FIGS. 5–8 also have similar advantages.

Switch 100 may be modified by replacing transistor 102 by a P-channel transistor where the polarity of the signal for controlling the gate of the transistor has been adjusted if necessary to accommodate a P-channel device. Where the P-channel device also has the above-described channel lengths and widths, switch 100 may be constructed to have a on-resistance of not more than 10 ohms.

The gate of transistor 102 is controlled by the output of a driver 104 which may include a pair of P-channel and N-channel resistors connected in parallel between node C and the gate of transistor 102. In order to increase the speed of switching, the pair of transistors in driver 104 would preferably each have a channel length of 1.5 microns or less and channel widths greater than 200 microns. Where a driver 104 and transistor 102 are fabricated as a stand-alone integrated circuit device 100 using the same fabrication technology, the transistors in device 100 may be grown so that all the transistors in the device have short channel lengths. Where device 100 is fabricated as an integrated circuit, it can be made in the form of a package having five pins for connection to nodes A, B, C, and to power and ground.

Figure 6:
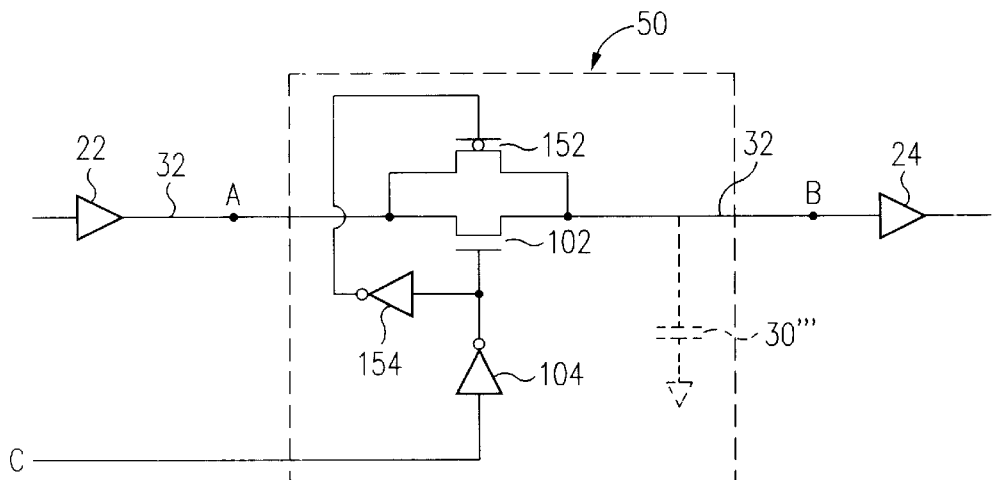
FIG. 6 is a schematic circuit diagram of a transmission gate switch and of a driver and receiver to illustrate an alternative embodiment of the invention.

FIG. 6 is a schematic circuit diagram of a transmission gate switch and of a driver and receiver to illustrate an alternative embodiment of the invention. As shown in FIG. 6, switch 150 includes a pair of N-channel transistor 102 and a P-channel transistor 152 connected in parallel between nodes A, B. The gate of transistor 102 is controlled by a driver 104 as in FIG. 5 and the gate of transistor 152 is controlled by the output of driver 154 whose input is connected to the output of driver 104. Where both transistors 102, 152 have the channel lengths and widths as those described above for transistor 102, the on-resistance of switch 150 would be 10 ohms or less.

Figure 7:
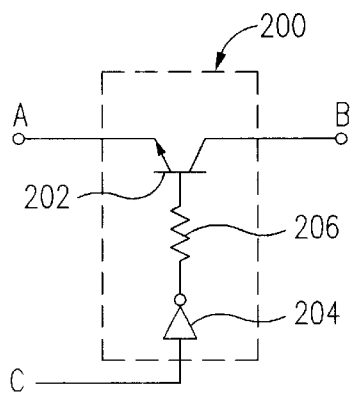
FIGS. 7 and 8 are schematic circuit diagrams of two different transmission gate switches to illustrate additional alternative embodiments of the invention.
Figure 8:
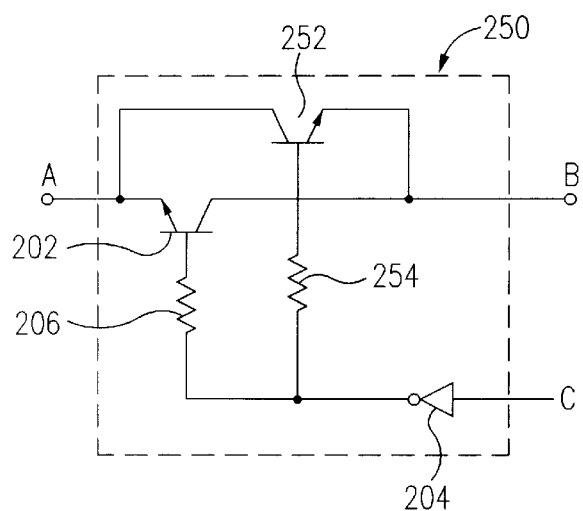

FIGS. 7 and 8 are schematic circuit diagrams of two different transmission gate switches to illustrate additional alternative embodiments of the invention. Bipolar transistors typically have on-resistances of less than 10 ohms so that they may be used instead of MOS transistor 102. Such configuration is illustrated in switch 200 of FIG. 7. While a npn transistor 202 is employed in switch 200, it will be understood that a pnp type transistor may be used instead and is within the scope of the invention. As shown in FIG. 7, the base of transistor 202 is controlled by the output of a driver 204 through resistor 206. Driver 204 may be one of the 7400 TTL series of logic gates, such as the 74F04 gate.

In FIG. 8, a back to back connection of two npn transistors 202 and 252 are shown for switch 250, although 2 pnp transistors may be used instead. It is known that for a bipolar transistor, unlike a MOS transistor, the current flowing between the collector and emitter is greater in one direction than the other. By placing two transistors 202, 252 in two parallel paths and connected to nodes A, B so that each node is connected to a collector of one transistor and the emitter of the other transistor (anti-parallel arrangement), currents will flow through the path of lesser resistance in each direction so that the amount of current that needs to be pumped through the switch is reduced.

Figure 9:
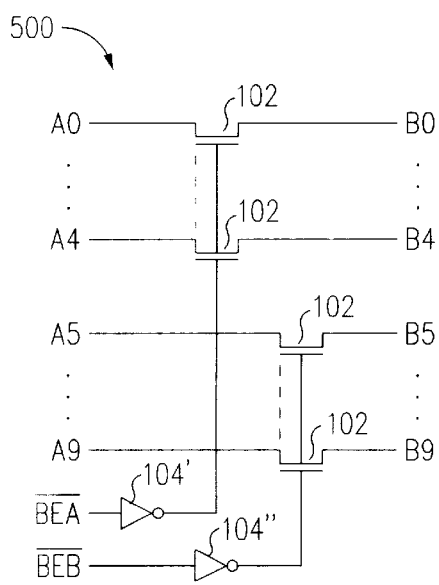
FIG. 9 is a schematic view of a bus switch for switching signals between two sets of bus lines to illustrate applications of the invention.

FIG. 9 is a schematic circuit diagram of a CMOS bus switch device employing the invention for switching the signals between two sets of bus lines. Quality Semiconductor, Inc. of Santa Clara, Calif., assignee of the present application, has employed the present invention for bus switches such as one shown in FIG. 9 in product 74FCT3384. As shown in FIG. 9, switch device 500 is a high speed TTL bus connect device. When enabled, the bus switch device directly connects two buses with the connection resistance of less than 5 ohms. The five lines A0, A1, A2, A3, A4 in bus A are each connected through a transistor 102 to the bus lines B0, B1, B2, B3, B4 respectively. The five transistors 102 connecting A0–A4 to B0–B4 have their gates controlled by the output of driver 104'. Similarly, the five lines A5–A9 in bus A are connected to the respective one of the five bus lines B5–B9 in bus B through transistors 102 whose gates are controlled by the outputs of a driver 104". Thus switch device 500 includes ten switches 102 arranged as two banks of five and controlled by two different drivers. This allows switch device 500 to be used as a 10-bit switch or as a 5-bit, 2-to-1 multiplexer. This is accomplished by electrically connecting the pairs of lines B0–B5, B1–B6, B2–B7, B3–B8 and B4–B9. In such event, when the output of driver 104' is high, the signals present on lines A0–A4 will be transmitted to the B bus whereas if the output of driver 104" is high, the signals present on lines A5–A9 will be transmitted to the B bus instead to accomplish the 2-to-1 multiplexer function. When the output of one of the two drivers is low, the transistors driven by the driver will be turned off and the respective bus lines connected by such transistors are disconnected from one another. The above-described function is summarized in the Function Table below.

| | | Function Table: | |
|---|---|---|---|
| BEA | BEB | B0-4 | B5-9 Function |
| H | H | Hi-Z | Hi-Z Disconnect |
| L | H | A0-4 | Hi-Z Connect |
| H | L | Hi-Z | A5-9 Connect |
| L | L | A0-4 | A5-9 Connect |

Device 500 includes in essence ten switches, where each switch includes an N-channel MOS transistor driven by a CMOS gate. When the switch is enabled, the gate of the N-channel transistor is at Vcc (+5 volts) and the device is on. These devices have an on resistance of less than 5 ohms for voltages near ground and will drive in excess of 64 mA each. The resistance rises somewhat as the I/O voltage rises from a TTL low of 0.0 volts to a TTL high of 2.4 volts. In this region the A and B pins are solidly connected, and the bus switch is specified in the same manner as a TTL device over this range. As the I/O voltage rises to approximately 4.0 volts, the transistor turns off. This corresponds to a typical TTL high of 3.5 to 4.0 volts.

Figure 10:
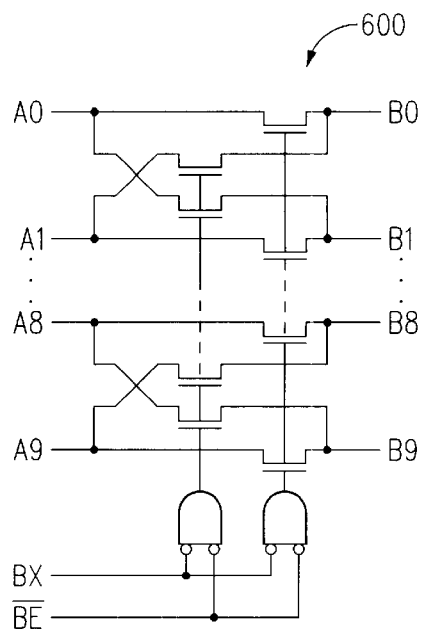
FIG. 10 is a schematic circuit diagram of a bus exchange switch to illustrate applications of the invention.

FIG. 10 is a schematic circuit diagram of a CMOS bus exchange switch 600 in another product 74FCT3383. Switch 600 comprises two banks of ten switches arranged to gate through or exchange two banks of five signals. This allows switch 600 to be used as a 10-bit switch or as a 5-bit, two-way bus exchange device. Switch 600 is particularly useful for exchange and routing operations such as byte swap, crossbar matrices, and RAM sharing. The functions of switch 600 are summarized in the Table below.

| | | Function Table: | |
|---|---|---|---|
| BE | BX | B0-8 | B1-9 Function |
| H | X | Hi-Z | Hi-Z Disconnect |
| L | L | A0-8 | A1-9 Connect |
| L | H | A1-9 | A0-8 Exchange |

Figure 11A:
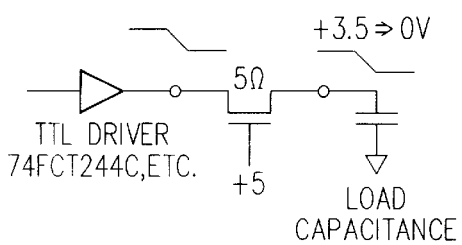
FIGS. 11A, 11B are schematic circuit diagrams illustrating the operation of the circuit in FIGS. 5A–5D.
Figure 11B:
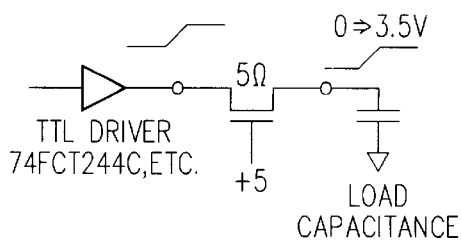

The bus switch provides a path for a driving device to drive capacitance to ground and to drive capacitance up from ground. This is shown in FIGS. 11A, 11B. When the A (or B) input is driven to a TTL low of 0.0 volts, the N-channel transistor is fully on and the B (or A) output will follow it. Likewise, when the A (or B) input is driven from a TTL low of 0.0 volts to a TTL high, the capacitor side of the N-channel switch is at 0.0 volts, the switch is fully on and the B (or A) output will follow it through threshold and beyond. This means that the rise and fall time characteristics and waveforms of the B (or A) output will be determined by the TTL driver, not the bus switch. The switch introduces insignificant propagation delay.

When the bus switch is disabled, the N-channel transistor gate is at 0.0 volts, and the transistor is off. By the nature of the N-channel transistor design, the A and B pins are fully isolated when the transistor is off. Leakage and capacitance is to the chip substrate (i.e., ground) rather than between input and output. This minimizes feedthrough in the off state. Because only an N-channel transistor is used, either A or B pin(s) can be taken to Vcc and above, and the device can be powered down without loading either bus.

Figure 12A:
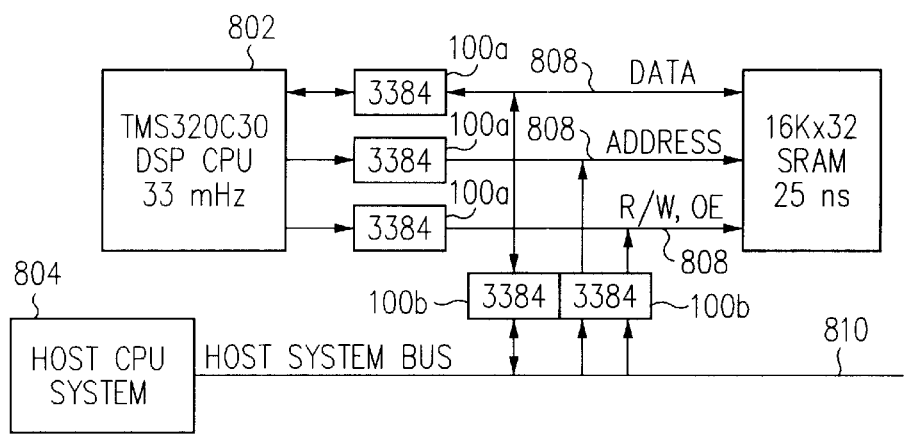
FIG. 12A is a block diagram of a computer system illustrating the applications of the invention.

FIG. 12A shows bus switches (labeled 3384) 100a, 100b of the type in FIG. 9 used to allow the memory for a DSP slave processor 802 to be accessed by the host processor 804. Each switch may include one or more switch devices of the type similar to switch 100 of FIG. 5A; for this reason, they are labeled 100a, 100b. A 33 mHz TMS320C30 system is shown with a 16K×32 SRAM 806 as its program and data storage memory. The SRAM is connected to the DSP CPU by 3384 devices 100a through bus 808. The SRAM is connected to the CPU 804 through devices 100b and bus 810. Each of the switches 100a, 100b is driven by a driver (not shown) such as driver 104 of FIG. 5A.

When switches 100a are turned on and switches 100b are turned off, the DSP 802 is connected to SRAM 806. If it is desired for the CPU 804 to be connected to SRAM 806 instead, it is necessary to turn off switches 100b and turn on switches 100b. At a typical clock cycle of 30 nanoseconds for CPU and DSP operations, the turning on and off times of switches 100a, 100b cannot be more than several nanoseconds. Therefore, it will be desirable for drivers 104 driving transistors 102 in switches 100a, 100b to be such that the transistors 102 can be turned on and off within several nanoseconds. In order to turn each of the transistors 102 on or off, the gate of the transistor must be driven from logic low to logic high, or vice versa. The speed at which this will happen depends on the drive capability of drivers 104 as well as the gate to drain and source capacitances of the transistors 102.

Thus, even though mechanical relays have low on resistance, the turn on and turn off times of mechanical relays are in the millisecond range and are generally not acceptable for switching bus signals for computers or logic devices. Solid state switches constructed using MOS power transistors also have low on resistances. However, these devices have very large gate to source and drain capacitances and are generally of less than several nanoseconds. The above-described fast transmission gate switches of this invention have both low on resistance and internal capacitances as well as fast turning on and off times. Where the transistors in the drivers 104 (and of drivers 104', 104") have channel lengths of 1.5 microns or less and channel widths of 200 microns or more, and the gate to drain and source capacitances of transistor 102 are of the order of 1 or 2 pF, transistor 102 can be turned on or off upon the application of a switching signal to node C in a just a few nanoseconds, in any event less than 7 nanoseconds. This is comparable to the turning on and off times of standard 74F244 buffers.

Figure 12B:
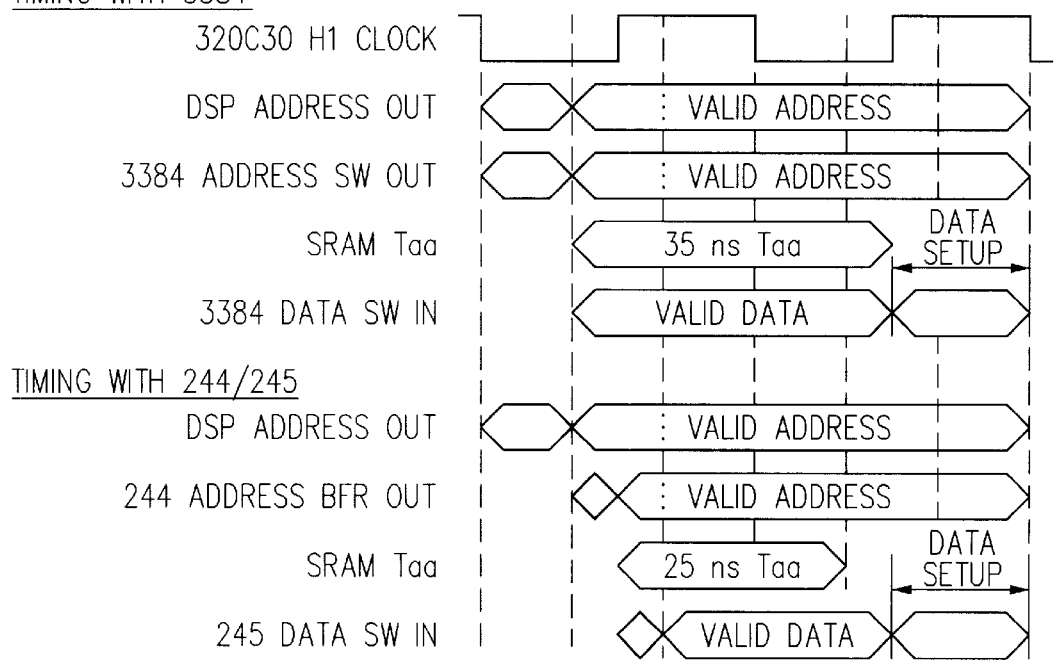
FIG. 12B is a timing diagram illustrating the operation of the system in FIG. 12A.

As indicated above, the preferred embodiment of switches of this invention reduces the signal delay between the logic devices to less than 1 nanosecond and therefore permits full speed operation of the CPU 804 and DSP 802. This saves 10 ns over using conventional fast buffers and transceivers, i.e., 5 ns for a 244 address buffer to the SRAM and 5 ns for a 245 address transceiver from the SRAM, as shown in the timing diagrams in FIG. 12B. This allows using SRAMs with 35 ns Taa (access time) instead of 25 ns. Between calculations, the 3384 devices 100a, 100b disconnect the SRAM from the DSP CPU and connect it to the host CPU, allowing the host to write data in before the DSP calculation and read data out after.

While the invention is described above in reference to preferred embodiments, it will be understood that various modificaitons may be made without departing from the scope of the invention, which is limited only by the appended claims.

What is claimed is:

1. A switching device for switching signals in a bi-directional manner along a bus of a printed circuit board, the switching device comprising:

a package containing an integrated circuit device that includes a first field effect transistor and a driver circuit, the first transistor having an internal resistance $R_i$ and an internal capacitance $C_i$, the first transistor including a first input/output terminal, a second input/output terminal and a control terminal, the driver circuit having an output terminal coupled to the control terminal of the first transistor;

a first input/output lead directly connected to the first input/output terminal and extending external to the package, the first input/output lead being connected to the bus of the printed circuit board;

a second input/output lead directly connected to the second input/output terminal and extending external to the package, the second input/output lead being connected to the bus of the printed circuit board, the bus having a bus capacitance $C_b$, wherein $C_b$ is finite and greater than $C_i$, wherein $R_i(C_i+C_b)$ is greater than zero and less than 6.5 nanoseconds; and a control lead coupled to an input terminal of the driver circuit, the control lead extending external to the package, wherein the first transistor is turned on and off in response to a control signal applied to the control lead, the first transistor being configured to pass signals in a bi-directional manner on the bus when the first transistor is turned on, and the first transistor being configured to block signals on the bus when the first transistor is turned off.

2. The switching device of claim 1, wherein said driver circuit includes one or more MOS transistors forming a driver circuit gate, and wherein the channel lengths of the one or more MOS transistors of the driver circuit gate are greater than zero and less than 1.5 microns and the channel widths of the one or more MOS transistors of the driver circuit gate are finite and greater than 200 microns.

3. The switching device of claim 2, wherein said driver circuit gate is an inverter.

4. The switching device of claim 1, wherein the internal capacitance Ci of the first transistor when the first transistor is turned on is greater than zero and not more than 20 pF.

5. The switching device of claim 1, wherein the resistance Ri of the first transistor when the first transistor is turned on is greater than zero and less than 50 ohms.

6. The switching device of claim 1 wherein the first transistor has a channel length greater than zero and less than 1.5 microns, and wherein the first transistor has a channel width that is finite and greater than 1000 microns.

7. The switching device of claim 1, the integrated circuit device further comprising:
a second field effect transistor having an internal resistance $R_{i2}$ and an internal capacitance $C_{i2}$, the second transistor including a first input/output terminal, a second input/output terminal and a control terminal, the first and second input/output terminals of the second transistor being connected respectively to the first and second input/output terminals of the first transistor, the output terminal of the driver circuit being coupled to the control terminal of the second transistor.

8. The switching device of claim 7, wherein said first and second transistors are respectively N-channel and P-channel MOS transistors.

9. The switching device of claim 7, wherein the resistance $R_{12}$ of the second transistor when the second transistor is turned on is greater than zero and less than 50 ohms.

10. The switch of claim 9, wherein second transistor has a channel length greater than zero and less than 1.5 microns, and wherein the second transistor has a channel width that is finite and greater than 1000 microns.

11. The switching device of claim 1, wherein the first transistor is an P-channel transistor.

12. The switching device of claim 1, wherein the first transistor is an N-channel transistor.

13. The switching device of claim 1 wherein the first transistor is a MOS Device.

14. The switching device of claim 1, wherein $R_i (C_1+C_b)$ is greater than zero and less than 1 nanosecond.

15. The switching device of claim 14, wherein $R_i (C_i+C_b)$ is about 0.3 nanoseconds.

16. The switching device of claim 6, wherein the channel length is greater than zero and less than 1 micron.

17. The switching device of claim 6, wherein the channel width is finite and greater than 1200 microns.

18. The switching device of claim 5, wherein the resistance Ri of the first transistor when the first transistor is turned on is greater than zero and less than 10 ohms.

19. The switching device of claim 18, wherein the resistance Ri of the first transistor when the first transistor is turned on is greater than zero and less than 5 ohms.

20. A switching device for switching signals in a bi-directional manner along a bus of a printed circuit board, the switching device comprising:
a package containing an integrated circuit device that includes a first plurality of field effect transistors and a driver circuit, each of the first plurality of transistors having an internal resistance $R_i$ and an internal capacitance $C_i$, each of the first plurality of transistors including a first input/output terminal, a second input/output terminal and a control terminal, the driver circuit having an output terminal coupled to the control terminal of each of the first plurality of transistors;
multiple first input/output leads directly connected to corresponding first input/output terminals and extending external to the package, the first input/output leads being connected to corresponding bus lines of the bus of the printed circuit board;
multiple second input/output leads directly connected to corresponding second input/output terminals and extending external to the package, the second input/output leads being connected to corresponding bus lines of the bus of the printed circuit board, each of the bus lines having a bus capacitance $C_b$, wherein $C_b$ is finite and greater than $C_i$, wherein $R_i (C_i+C_b)$ is greater than zero and less than 6.5 nanoseconds; and
a control lead coupled to an input terminal of the driver circuit, the control lead extending external to the package, wherein the first plurality of transistors are turned on and off in response to a control signal applied to the control lead, the first plurality of transistors being configured to pass signals in a bi-directional manner on the bus when the first plurality of transistors are turned on, and the first plurality of transistors being configured to block signals on the bus when the first plurality of transistors are turned off.

21. The switching device of claim 20 wherein each of the multiple transistors is a MOS device.

22. The switching device of claim 20, wherein the driver circuit includes one or more MOS transistors forming a driver circuit gate, and wherein the channel lengths of the one or more MOS transistors of the driver circuit gate are greater than zero and less than 1.5 microns and the channel widths of the one or more MOS transistors of the driver circuit gate are finite and greater than 200 microns.

23. The switching device of claim 22, wherein said driver circuit gate is an inverter.

24. The switching device of claim 20, wherein the internal capacitance Ci of each of the multiple transistors when turned on is greater than zero and not more than 20 pF.

25. The switching device of claim 20, wherein the resistance Ri of the each of the multiple transistors when turned on is greater than zero and less than 50 ohms.

26. The switching device of claim 20, wherein each of the multiple transistors has a channel length greater than zero and less than 1.5 microns, and wherein each of the multiple transistors has a channel width that is finite and greater than 1000 microns.

27. The switching device of claim 20, the integrated circuit device further comprising:
a second plurality of field effect transistors and a second driver circuit, each of the second plurality of transistors having an internal resistance $R_i$ and an internal capacitance $C_i$, each of the second plurality of transistors including a first input/output terminal, a second input/output terminal and a control terminal, the second driver circuit having an output terminal coupled to the control terminal of each of the second plurality of transistors;
multiple third input/output leads directly connected to corresponding first input/output terminals of the second plurality of transistors and extending external to the package, the third input/output leads being connected to corresponding bus lines of the bus of the printed circuit board;
multiple fourth input/output leads directly connected to corresponding second input/output terminals of the second plurality of transistors and extending external to the package, the fourth input/output leads being connected to corresponding bus lines of the bus of the printed circuit board, each of the bus line having a bus capacitance $C_b$, wherein $C_b$ is finite and greater than $C_i$, wherein $R_i (C_i+C_b)$ is greater than zero and less than 6.5 nanoseconds; and
a second control lead coupled to an input terminal of the second driver circuit, the second control lead extending external to the package, wherein the second plurality of transistors are turned on and off in response to a second control signal applied to the second control lead, the second plurality of transistors being configured to pass signals in a bi-directional manner on the bus when the second plurality of transistors are turned on, and the second plurality of transistors being configured to block signals on the bus when the second plurality of transistors are turned off.

28. The switching device of claim 20, wherein the first plurality of transistors comprise N-channel MOS transistors.

29. The switching device of claim 20, wherein the first plurality of transistors comprise P-channel MOS transistors.

30. A digital system comprising:

a printed circuit board having a bus with a bus capacitance $C_b$;

a first logic device mounted on the printed circuit board and coupled to the bus;

a second logic device mounted on the printed circuit board and coupled to the bus;

a package containing an integrated circuit device that includes a first field effect transistor and a driver circuit, the first transistor having an internal resistance $R_i$ and an internal capacitance $C_i$, wherein $C_i$ is less than $C_b$, and wherein $(C_i+C_b)$ is greater than zero and less than 6.5 nanoseconds, the first transistor including a first input/output terminal, a second input/output terminal and a control terminal, the driver circuit having an output terminal coupled to the control terminal of the first transistor;

a first input/output lead directly connected to the first input/output terminal and extending external to the package, the first input/output lead being connected to the first logic device by the bus of the printed circuit board;

a second input/output lead directly connected to the second input/output terminal and extending external to the package, the second input/output lead being connected to second logic device by the bus of the printed circuit board,; and a control lead coupled to an input terminal of the driver circuit, the control lead extending external to the package, wherein the first transistor is turned on and off in response to a control signal applied to the control lead, the first transistor being configured to pass signals in a bi-directional manner between the first and second logic devices on the bus when the first transistor is turned on, and the first transistor being configured to block signals between the first and second logic devices on the bus when the first transistor is turned off.

31. The digital system of claim 30, wherein the first transistor is a MOS device.

\* \* \* \* \*